United States Patent [19]
Wachi et al.

[11] Patent Number: 6,131,511
[45] Date of Patent: Oct. 17, 2000

[54] SCREEN PRINTING METHOD AND SCREEN PRINTING APPARATUS

[75] Inventors: Akihiko Wachi, Nakakoma-gun; Seishiro Yanachi, Kofu; Nobuyuki Kakishima, Kofu; Masaya Matsumoto, Kofu, all of Japan

[73] Assignee: Matsushita Electric Industrial Co., Ltd., Osaka, Japan

[21] Appl. No.: 09/194,904

[22] PCT Filed: Jun. 12, 1997

[86] PCT No.: PCT/JP97/02027

§ 371 Date: Dec. 4, 1998

§ 102(e) Date: Dec. 4, 1998

[87] PCT Pub. No.: WO97/48258

PCT Pub. Date: Dec. 18, 1997

[30] Foreign Application Priority Data

Jun. 14, 1996 [JP] Japan ................................. 8/154332

[51] Int. Cl.[7] .................................................. B41F 15/08
[52] U.S. Cl. ................ 101/129; 101/126; 101/DIG. 36; 33/620
[58] Field of Search ..................... 101/114, 126, 101/129, DIG. 36, 485, 486; 33/614, 620

[56] References Cited

U.S. PATENT DOCUMENTS

| 4,516,495 | 5/1985 | Ericsson ........................ 101/DIG. 36 |
| 4,610,200 | 9/1986 | Metso ........................ 101/126 |
| 4,953,459 | 9/1990 | Ericsson ........................ 101/129 |
| 5,168,805 | 12/1992 | Kasanami et al. .............. 101/129 |
| 5,176,078 | 1/1993 | Homma et al. ................. 101/126 |

FOREIGN PATENT DOCUMENTS

| 259446 | 12/1985 | Japan ................ 101/DIG. 36 |
| 01297888 | 11/1989 | Japan . |
| 02123788 | 5/1990 | Japan . |
| 02188991 | 7/1990 | Japan . |
| 03020099 | 1/1991 | Japan . |
| 130155 | 6/1991 | Japan ................ 101/126 |
| 04353448 | 12/1992 | Japan . |
| 131610 | 5/1993 | Japan ................ 101/DIG. 36 |
| 05185579 | 7/1993 | Japan . |
| 05229097 | 9/1993 | Japan . |
| 06182965 | 7/1994 | Japan . |
| 06198841 | 7/1994 | Japan . |
| 08001906 | 1/1996 | Japan . |
| 08058058 | 3/1996 | Japan . |

*Primary Examiner*—Stephen R. Funk
*Attorney, Agent, or Firm*—Wenderoth, Lind & Ponack, L.L.P.

[57] ABSTRACT

Coordinate positions of openings and lands on a screen and a first circuit board are recognized by a recognition camera and a display device. A correction amount for movement of the stage is calculated by a control device only for the first circuit board. Then, the correction of movement of the stage is executed for the second and following circuit boards by utilizing the correction amount.

12 Claims, 8 Drawing Sheets

SCREEN PRINTING METHOD AND SCREEN PRINTING APPARATUS

TECHNICAL FIELD

The present invention relates to a screen printing method and a screen printing apparatus for implementing printing onto a circuit board by using a screen.

BACKGROUND ART

With reference to FIGS. 7 to 9 illustrating a screen printing apparatus and FIG. 10 illustrating a flow chart of a screen printing method of the prior art, the screen printing method of the prior art is described.

As an apparatus for printing solder paste to a printed board 50 equivalent to the circuit board, there has been provided a screen printing apparatus 30 which comprises a recognition device 10 and a printing device 20, as shown in FIG. 7.

The recognition device 10 comprises a stage 1, motors 3 to 5 for moving the stage 1 in X, Y and θ directions as illustrated, a recognition camera 2 for recognizing recognition marks 51, 52 drawn on the printed board 50 as well as recognition marks 24, 25 drawn on a screen 21, and a control device 6 electrically connected to the recognition camera 2 and the motors 3 to 5.

The printing device 20 comprises the screen 21 on which a pattern showing the arrangement of openings for printing solder paste to the printed board 50 is formed, and a squeegee 22 for spreading the solder paste 23 placed on the screen 21 over the whole surface of the screen 21.

The control device 6 controls the drive of the motors 3 to 5 based on image information obtained from the recognition camera 2 in order that the pattern of the openings of the screen 21 matches a pattern printing position on the printed board 50 where the pattern should be printed on the printed board 50.

In this screen printing apparatus 30 having such a constitution, the stage 1 reciprocatingly moves between a printed-board loading/unloading position 182 and a just-under-the-screen position 183 where the stage 1 is located just under the screen 21, relative to the screen 21 that is fixed. Due to this movement, the printing operation is executed according to the steps as shown in FIG. 10.

More specifically, at Step (represented by "S" in the FIG.) 1, the printed board 50 is placed on the stage 1 at the printed-board loading/unloading position 182. At Steps 2 to 4, positional correction of the printed board 50 relative to the screen 21, which will be detailed later, is carried out. Thereafter, at Step 5, the stage 1 is moved to the just-under-the-screen position 183. Also at Step 5, the stage 1 is moved toward the screen 21 at the just-under-the-screen position 183. At Step 6, the screen 21 and the printed board 50 are brought into contact with each other, in which state printing is performed. In this printing process, the squeegee 22 lowers to the screen 21, and the squeegee 22 is moved leftward or rightward in the figure, by which the solder paste 23 is printed to the printed board 50 according to the pattern of the openings of the screen 21. After the printing, at Step 7, the stage 1 lowers, returning from the just-under-the-screen position 183 to the printed-board loading/unloading position 182 once again, whereby the printed board 50 after the printing process is removed from the stage 1. Then, another printed board 50 to be printed is placed on the stage 1 again, and the above operations are repeated.

The positional correction of the printed board 50 in Steps 2 to 4 is now explained.

The positional correction is to correct the position of the printed board 50 relative to the screen 21 so that the printed board 50 to be printed is placed at a specified position relative to the fixed screen 21. Information for achieving such positional correction is obtained by recognizing the recognition marks 24, 25 of the screen 21 and the recognition marks 51, 52 of the printed board 50, which is implemented by the recognition camera 2 moving. A detailed description is given below with reference to FIGS. 11 and 12.

First, the recognition of the recognition marks 24, 25 of the screen 21 is explained. A distance (SX1, SY1) from the origin 2a of the recognition camera 2 with respect to the recognition mark 24, and a distance (SX2, SY2) from the origin 2a of the recognition camera 2 with respect to the recognition mark 25 are calculated by the following equation [1]:

$$SX1 = Sx1 + Cx1 \times SCx1$$
$$SY1 = Sy1 + Cy1 \times SCy1$$
$$SX2 = Sx2 + Cx1 \times SCx2$$
$$SY2 = Sy2 + Cy1 \times SCy2 \quad [1]$$

where

Sx1, Sx2 are coordinate values of the recognition marks 24, 25 in the X direction, respectively, when the camera origin 2a is taken as the origin of the X-Y coordinate axes;

Sy1, Sy2 are coordinate values of the recognition marks 24, 25 in the Y direction, respectively, when the camera origin 2a is taken as the origin of the X-Y coordinate axes;

Cx1 is the resolution of the recognition camera 2 in the X direction, and Cy1 is the resolution of the recognition camera 2 in the Y direction;

SCx1, SCx2 are the numbers of pixels in the X direction within the effective field of view with respect to the recognition marks 24, 25, respectively; and SCy1, SCy2 are the numbers of pixels in the Y direction within the effective field of view with respect to the recognition marks 24, 25, respectively.

A distance from the camera origin 2a to the midpoint of the recognition marks 24, 25 is assumed as (SMX, SMY), and an internal angle formed by a straight line that connects these recognition marks 24, 25 to each other and a straight line parallel to the X direction is assumed as θs. In addition, the above distance (SMX, SMY) and angle θs represent the target position.

Next, a recognition mark 60 of the stage 1 is recognized in a state in which the stage 1 is located at the printed-board loading/unloading position 182 and in a state in which the stage 1 has been moved to the just-under-the-screen position 183, respectively, by which a travel amount (LX, LY) of the stage 1 is calculated.

After these operations are completed, the recognition of the recognition marks 51, 52 on the printed board 50 is performed. For this recognition operation, as in the foregoing case of the recognition marks 24, 25 of the screen 21, distances (PX1, PY1), (PX2, PY2) from the camera origin 2a to the recognition marks 51, 52 as shown in FIG. 12 are calculated by the following equation [2]:

$$PX1 = Px1 + Cx1 \times PCz1$$
$$PY1 = Py1 + Cy1 \times PCy1$$
$$PX2 = Px2 \times Cx1 \times PCx2$$
$$PY2 = Py2 + Cy1 \times PCy2 \quad [2]$$

where

Px1, Px2 are coordinate values of the recognition marks 51, 52 in the X direction, respectively, when the camera origin 2a is taken as the origin of the X-Y coordinate axes;

Py1, Py2 are coordinate values of the recognition marks 51, 52 in the Y direction, respectively, when the camera origin 2a is taken as the origin of the X-Y coordinate axes;

PCx1, PCx2 are the numbers of pixels in the X direction within the effective field of view with respect to the recognition marks 51, 52, respectively; and PCy1, PCy2 are the numbers of pixels in the Y direction within the effective field of view with respect to the recognition marks 24, 25, respectively.

A distance from the camera origin 2a to the midpoint of the recognition marks 51, 52 is assumed as (PMX, PMY), and an internal angle formed by a straight line that connects these recognition marks 51, 52 to each other and a straight line parallel to the X direction is assumed as θp.

Based on these descriptions, a sequence of operations for recognition and correction of the printed board 50 are now explained. A new printed board 50-1 is carried in and placed on the stage 1, and the recognition camera 2 positions the printed board 50-1 to the aforementioned positions (PX1, PY1), (PX2, PY2) by a command of the control device 6. In the same way as with the recognition operations performed on the printed board 50, recognition marks 51-1, 52-1 of the printed board 50-1 are recognized by the recognition camera 2, respectively. As a result, midpoint (PMX-1, PMY-1) and angle θp-1 between the two points are determined, respectively. Distances (PX1-1, PY1-1), (PX2-1, PY2-1) from the camera origin 2a to the recognition marks 51-1, 52-1, respectively, are calculated by the following equations:

$$PX1\text{-}1 = Px1 + Cx1 \times PCx1\text{-}1$$

$$PY1\text{-}1 = Py1 + Cy1 \times PCy1\text{-}1$$

$$PX2\text{-}1 = Px2 + Cx1 \times PCx2\text{-}1$$

$$PY2\text{-}1 = Py2 + Cy1 \times PCy2\text{-}1$$

where

PCx1-1, PCx2-1 are numbers of pixels in the X direction within the effective field of view with respect to the recognition marks 51-1, 52-1, respectively; and PCy1-1, PCy2-1 are the numbers of pixels in the Y direction within the effective field of view with respect to the recognition marks 51-1, 52-1, respectively.

Also, $$PMX\text{-}1 = \{(PX2\text{-}1) - (PX1\text{-}1)\}/2$$

$$PMY\text{-}1 = \{(PY2\text{-}1) - (PY1\text{-}1)\}/2$$

Adding the foregoing stage travel amount (LX, LY) to the midpoint (PMX-1, PMY-1) allows the position of the printed board 50-1 in the printing device 10 to be calculated.

Accordingly, compared with the case in which the printed board 50 is placed, move amounts Δx, Δy, Δθ of the stage 1 with respect to the printed board 50-1 can be determined by the following equations:

$$\Delta x = SMX - \{PPMX\text{-}1) + LY\}$$

$$\Delta y = SMY - \{(SMY\text{-}1) + LY\}$$

$$\Delta\theta = \theta s - \{(\theta p\text{-}1)\}$$

Move of the stage 1 is controlled based on these movements (Δx, Δy, Δθ), so that the stage 1 is moved to the printing device 20.

As described above, in the screen printing apparatus of the prior art, the printed board 50 is position-corrected by recognizing the recognition marks of the screen 21 and the printed board 50 then is transported to the screen 21, by which the printing is accomplished. As a result, the apparatus has had a disadvantage of being incapable of treating those printed boards 50 or the like having no recognition marks drawn thereon.

Further, in the screen printing apparatus of the prior art, as described above, each time a printed board 50 is placed on the stage 1, positional correction is performed for each printed board 50. However, the placement position where printed boards 50 are placed on the stage 1 would not differ among the individual printed boards 50 to such an extent that trouble occurs in printing. Accordingly, the prior-art screen printing apparatus was to execute unnecessary steps for each printed board, which would cause unnecessary increases in the time required for the printing of one printed board.

SUMMARY OF INVENTION

The present invention has been accomplished to solve these and other disadvantages. An object of the present invention is therefore to provide a screen printing method and a screen printing apparatus which are capable of executing a printing operation at higher speeds than the prior art. A further object of the present invention is to provide a screen printing method and a screen printing apparatus which are applicable also to screens and printed boards having no recognition marks provided thereon.

In accomplishing these objects, according to a first aspect of the present invention, there is provided a screen printing method to be executed by a screen printing apparatus which comprises a screen and a stage. In this apparatus circuit boards are placed successively at the same placement position on the stage at such a board loading/unloading position that the circuit board will not overlap with the screen. At least one of the stage and the screen is moved so that the screen and the circuit board are overlaid on each other.

Then the solder paste on the screen is printed on the circuit boards successively. The screen printing method comprises, when the screen is set to the screen printing apparatus, recognizing a set position of the screen relative to a recognition reference point.

When the circuit board is placed on the stage, a placement position of the circuit board relative to the recognition reference point is recognized. A correction amount for positions of the screen and the circuit board are calculated based on the set position recognized for the screen and the placement position recognized for the circuit board. Thereafter, for circuit boards of the same type to be placed on the stage successively, each time a circuit board of the circuit boards of the same type is placed on the stage, at least one of the stage and the screen is moved by taking into consideration the correction amount so that the screen and the circuit board are overlaid on each other. The solder paste provided on the screen is then printed at a pattern printing position on the circuit board.

According to a second aspect of the present invention, there is provided a screen printing method to be executed by a screen printing apparatus which comprises a screen and a stage. Circuit boards are placed successively at the same placement position on the stage at such a board loading/unloading position that the circuit board will not overlap with the screen. At least one of the stage and the screen is moved so that the screen and the circuit board are overlaid on each other, and solder paste on the screen is printed on the circuit boards successively.

The screen printing method comprises, when the screen is set to the screen printing apparatus, recognizing a set position of the screen relative to a recognition reference point. When the circuit board is placed on the stage, a placement position of the circuit board relative to the recognition reference point is recognized.

A correction amount for positions of the screen and the circuit board are calculated based on the set position recognized for the screen and the placement position recognized for the circuit board. At least one of the stage and the screen is moved by taking into consideration the correction amount so that the screen and the circuit board are overlaid on each other, and the solder paste provided on the screen is printed at a pattern printing position on the circuit board.

According to a third aspect of the present invention, there is provided a screen printing method according to the first or second aspect, wherein the recognizing of the screen set position is accomplished by arbitrarily detecting two different points on the screen and calculating positions of the two points relative to the recognition reference point. The recognizing of the circuit board placement position is then accomplished by arbitrarily detecting two different points on the circuit board and calculating positions of the two points relative to the recognition reference point.

According to a fourth aspect of the present invention, there is provided a screen printing method according to the third aspect, wherein the two different points on the screen are two different arbitrary openings in the screen.

According to a fifth aspect of the present invention, there is provided a screen printing method according to the third or fourth aspect, wherein the two different points on the circuit board are two different arbitrary lands on the circuit board.

According to a sixth aspect of the present invention, there is provided a screen printing method according to any one of the first through fifth aspects, wherein a reference state is where the solder paste on the screen has been printed to the pattern printing position where printing should be performed on the circuit board. The correction amount is calculated based on a shift between a position of the screen in the reference state and the screen set position, and on a shift between a position of the circuit board in the reference state and the circuit board placement position.

According to a seventh aspect of the present invention, there is provided a screen printing apparatus which comprises a screen and a stage. Circuit boards are placed successively at the same placement position on the stage at such a board loading/unloading position that the circuit board will not overlap with the screen. At least one of the stage and the screen is moved so that the screen and the circuit board are overlaid on each other, and solder paste on the screen is printed on the circuit boards successively.

The screen printing apparatus comprises an image capturing device for, when the screen is set to the screen printing apparatus, recognizing a set position of the screen relative to a recognition reference point, and for, when the circuit board is placed on the stage, recognizing a placement position of the circuit board relative to the recognition reference point. The apparatus also comprises a control device for calculating a correction amount for positions of the screen and the circuit board based on the set position recognized for the screen and the placement position recognized for the circuit board. Thereafter, for circuit boards of the same type to be placed on the stage successively, each time a circuit board of the circuit boards of the same type is placed on the stage, the control device moves at least one of the stage and the screen by taking into consideration the correction amount so that the screen and the circuit board are overlaid on each other. The control device then prints the solder paste provided on the screen to a pattern printing position on the circuit board.

According to an eighth aspect of the present invention, there is provided a screen printing apparatus comprising a screen and a stage. Circuit boards are placed successively at the same placement position on the stage at such a board loading/unloading position that the circuit board will not overlap with the screen. At least one of the stage and screen is moved so that the screen and the circuit board are overlaid on each other, and solder paste on the screen is printed on the circuit boards successively.

The screen printing apparatus comprises an image capturing device for, when the screen is set to the screen printing apparatus, recognizing a set position of the screen relative to a recognition reference point, and for, when the circuit board is placed on the stage, recognizing a placement position of the circuit board relative to the recognition reference point. The apparatus also comprises a control device for calculating a correction amount for positions of the screen and the circuit board based on the set position recognized for the screen and the placement position recognized for the circuit board. The control device also moves at least one of the stage and the screen by taking into consideration the correction amount so that the screen and the circuit board are overlaid on each other, and then prints the solder paste provided on the screen to a pattern printing position on the circuit board.

According to a ninth aspect of the present invention, there is provided a screen printing apparatus according to the seventh or eighth aspect, wherein the image capturing device recognizes the screen set position by arbitrarily detecting two different points on the screen and calculating positions of the two points relative to the recognition reference point. The image capturing device simultaneously recognizes the circuit board placement position by arbitrarily detecting two different points on the circuit board and calculating positions of the two points relative to the recognition reference point.

According to a tenth aspect of the present, invention, there is provided a screen printing apparatus according to the ninth aspect, wherein the two different points on the screen which the image capturing device recognizes are two different arbitrary openings in the screen.

According to an eleventh aspect of the present invention, there is provided a screen printing apparatus according to the ninth or tenth aspect, wherein the two different points on the circuit board which the image capturing device recognizes are two different arbitrary lands on the circuit board.

According to a twelfth aspect of the present invention, there is provided a screen printing apparatus which comprises a screen and a stage. Circuit boards are placed successively at the same placement position on the stage at such a board loading/unloading position that the circuit board will not overlap with the screen. At least one of the stage and the screen is moved so that the screen and the circuit board are overlaid on each other, and solder paste on the screen is printed on the circuit boards successively.

The screen printing apparatus comprises an image capturing device which moves to capture data of images of an arbitrarily selected place on the screen and an arbitrarily selected place on the circuit board. As a result, the device recognizes a screen set position relative to a recognition reference point and a circuit board placement position relative to the recognition reference point resulting when the circuit board has been placed on the stage. The apparatus also comprises a control device for calculating at least a correction amount for positions of the screen and the circuit board required for the solder paste on the screen to be printed to a pattern printing position on the circuit board. A reference state is that in which the solder paste on the screen has been printed to the pattern printing position where printing should be performed on the circuit board. The calculating of the correction amount is accomplished based on a shift between a position of the screen in the reference state and the screen set position, and based on a shift between a position of the circuit board in the reference state and the circuit board placement position.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
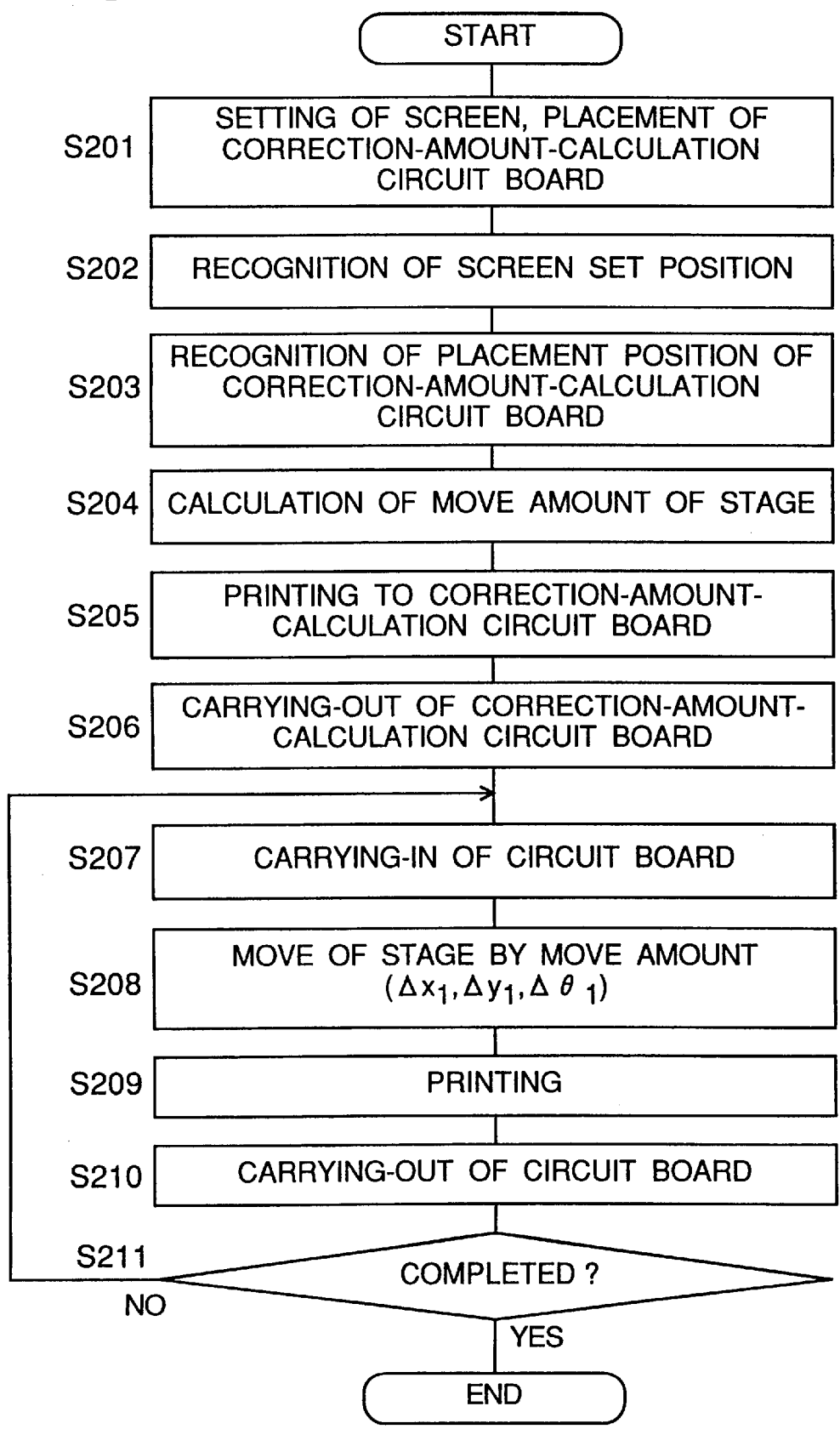
FIG. 1 is a flow chart showing the operation in the screen printing method, which is an embodiment of the present invention.

Before the description of the present invention proceeds, it is to be noted that like parts are designated by like reference numerals throughout the accompanying drawings.

A screen printing method as well as a screen printing apparatus 100, which are an embodiment of the present invention, are described below with reference to the accompanying drawings. It is noted that like components are designated by like reference numerals. Also, this screen printing method is to be executed by the screen printing apparatus 100.

When the screen and the circuit board are overlaid on each other, solder paste, as an example, is printed through the pattern of openings of the screen to a pattern printing position on the circuit board where the solder paste should be printed in the pattern to create lands on the circuit board. In this arrangement, a state in which the pattern formed by the openings of the screen is printed to the pattern printing position where the printing to the circuit board should be done is taken as a reference state. In the screen printing method and the screen printing apparatus of this embodiment, correction amounts for the placement of both the screen, which is placed at the screen printing apparatus, and the circuit board into the reference state are calculated. After the calculation, the printing onto the circuit board is performed successively based on the calculated correction amounts without calculating the correction amounts for each circuit board. In this arrangement, the correction amounts are calculated based on a shift between the position of the screen in the reference state and the screen set position, and based on a shift between the position of a correction-amount-calculation circuit board in the reference state and the placement position where the correction-amount-calculation circuit board has been placed on the stage.

In addition, the correction-amount-calculation circuit board refers to one arbitrary circuit board among circuit boards of a kind on which the printing work is to be done. The circuit board is used to calculate correction amounts for positions of the screen and the circuit board necessary for the pattern of openings of the screen to be printed at the pattern printing position where the pattern should be printed onto the circuit board.

Figure 2:
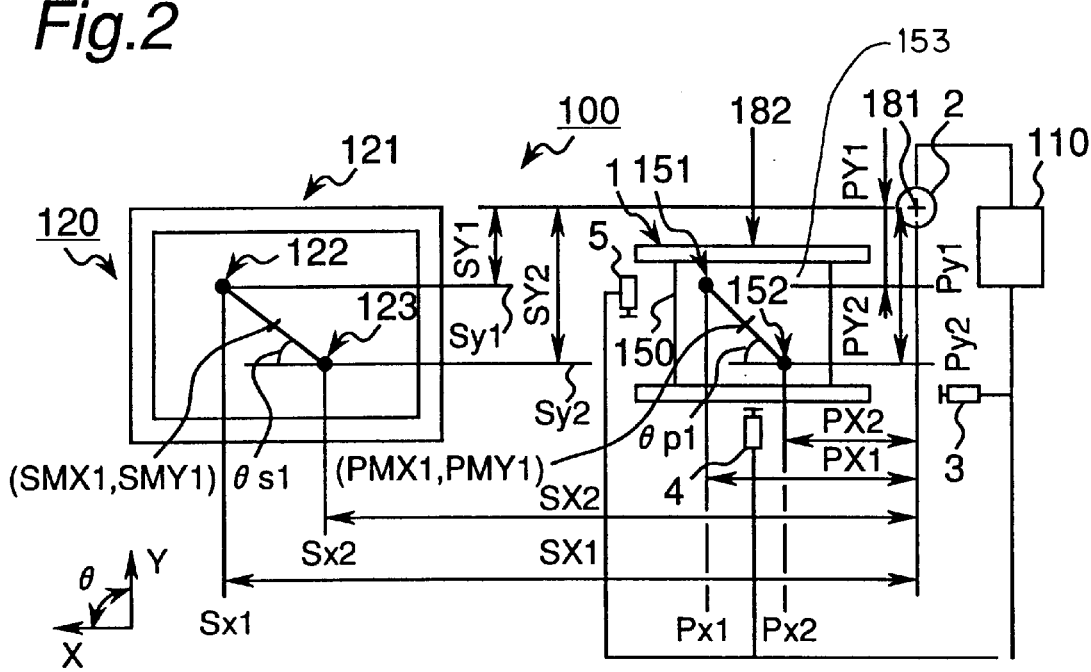
FIG. 2 is a diagram for explaining the method of determining the correction amount for movement of the stage, as shown in the flow chart of FIG. 1.
Figure 5:
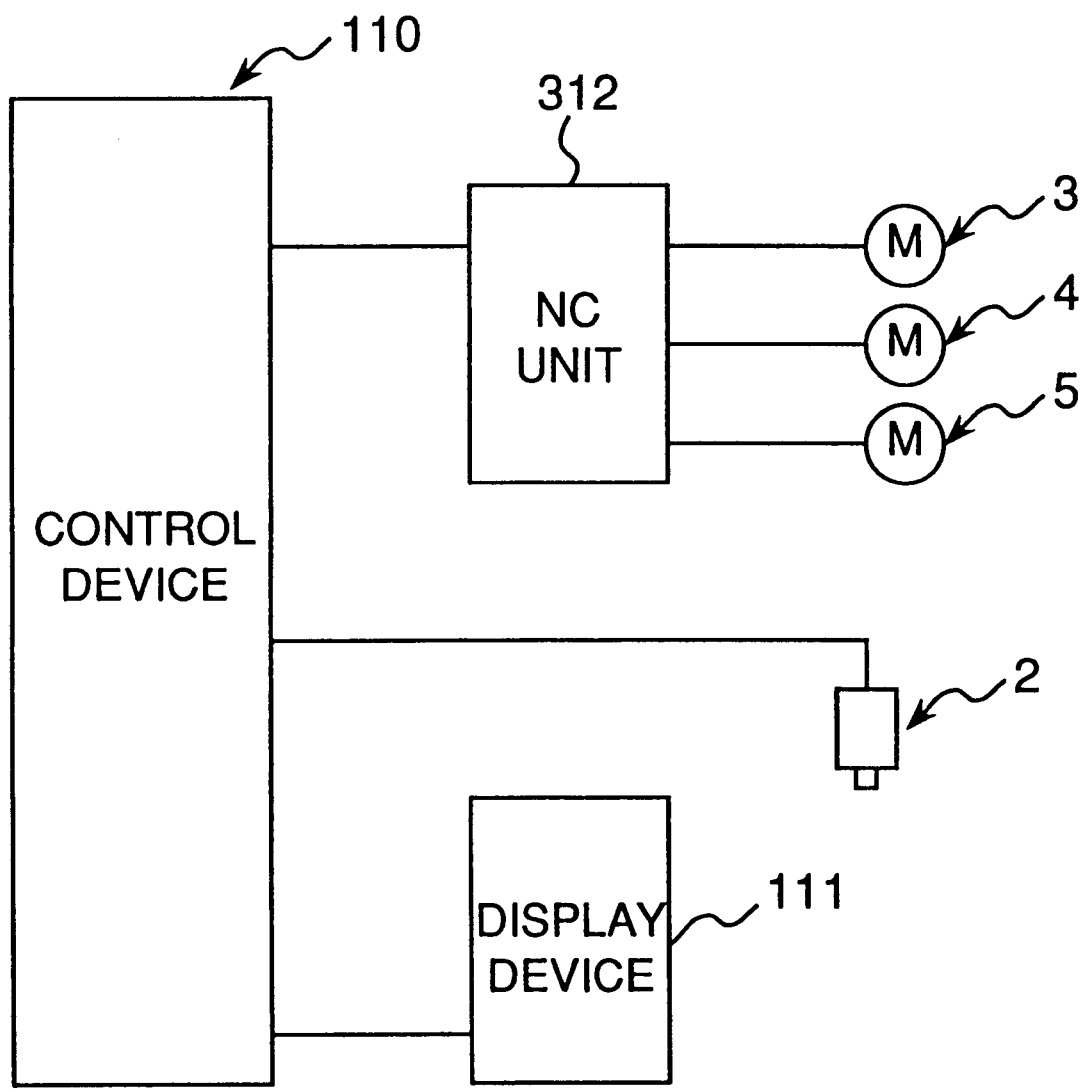
FIG. 5 is a block diagram showing electrical connections of the control device, recognition camera, and the like, as shown in FIG. 2.

The screen printing apparatus 100 is roughly similar in constitution to the foregoing screen printing apparatus 30 of the prior art. More specifically, as shown in FIGS. 2 and 5, the screen printing apparatus 100 comprises a screen 121, a stage 1, a recognition camera 2 serving as an image capturing device, motors 3 to 5, and a control device 110 to which the recognition camera 2 and an NC part 312 for controlling the motors 3–5 are electrically connected. However, as compared with the conventional screen printing apparatus, the screen printing apparatus 100 is applicable also to those screens 121 and circuit boards having no recognition marks drawn. For this purpose, a display device 111 which visibly displays the pattern of openings on the screen 121 and the pattern of placement of lands (pads) on the circuit board (which are shot by the recognition camera 2) is electrically connected to the control device 110.

In addition, in the screen printing apparatus 100, it is assumed that circuit boards to be placed on the stage 1 one by one are placed at the same placement position on the stage 1 at all times.

Figure 6:
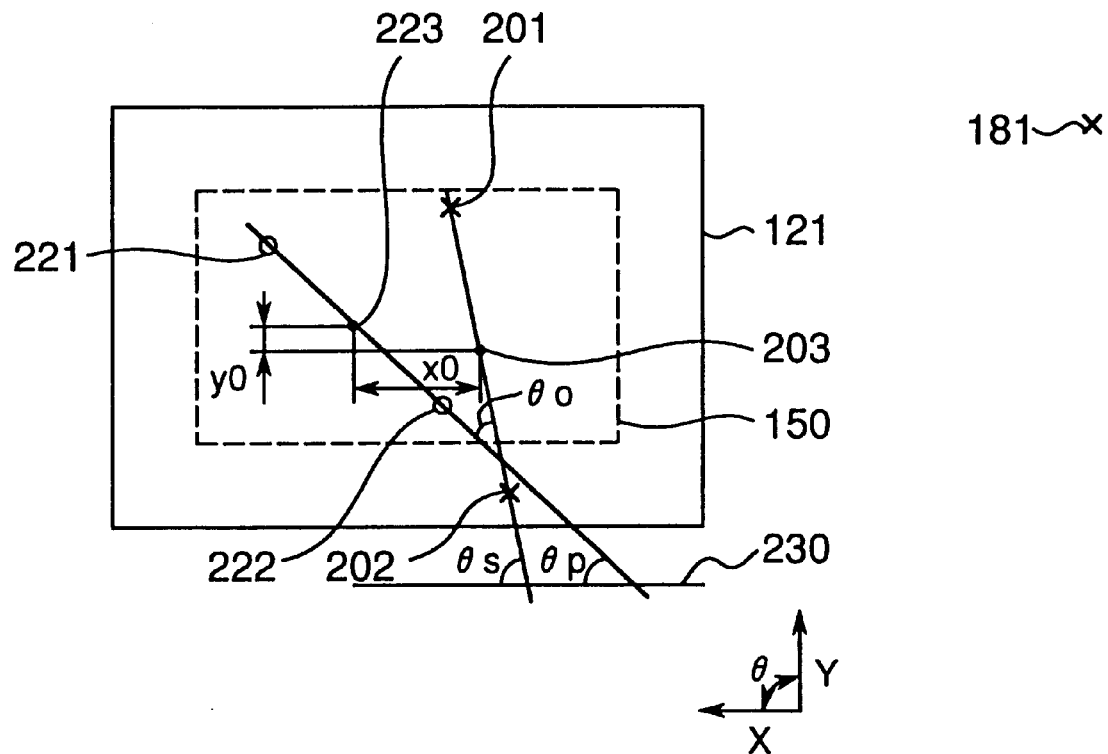
FIG. 6 is a diagram for explaining the method of determining the correction amount for movement of the stage, as shown in the flow chart of FIG. 1.
Figure 7:
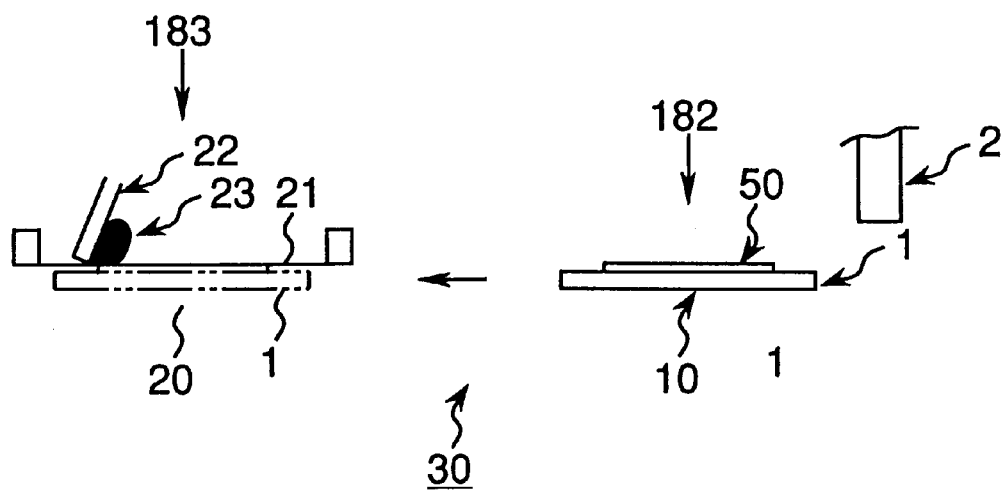
FIG. 7 is a general view of the screen printing apparatus of the prior art.
Figure 8:
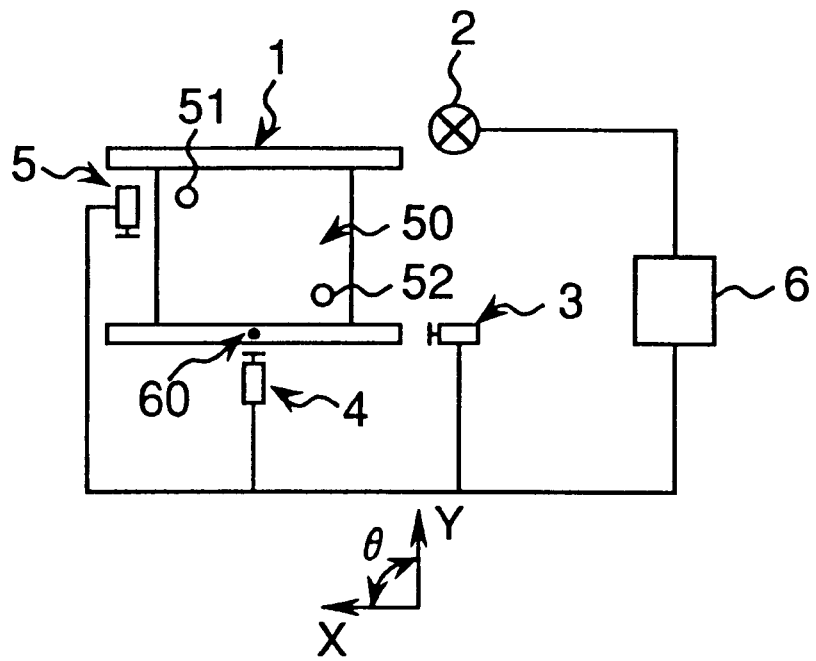
FIG. 8 is a plan view showing the stage and the like in a screen printing apparatus of the prior art.
Figure 9:
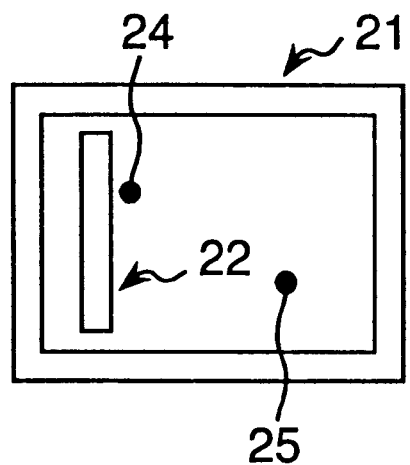
FIG. 9 is a plan view showing the screen in the screen printing apparatus of the prior art.
Figure 10:
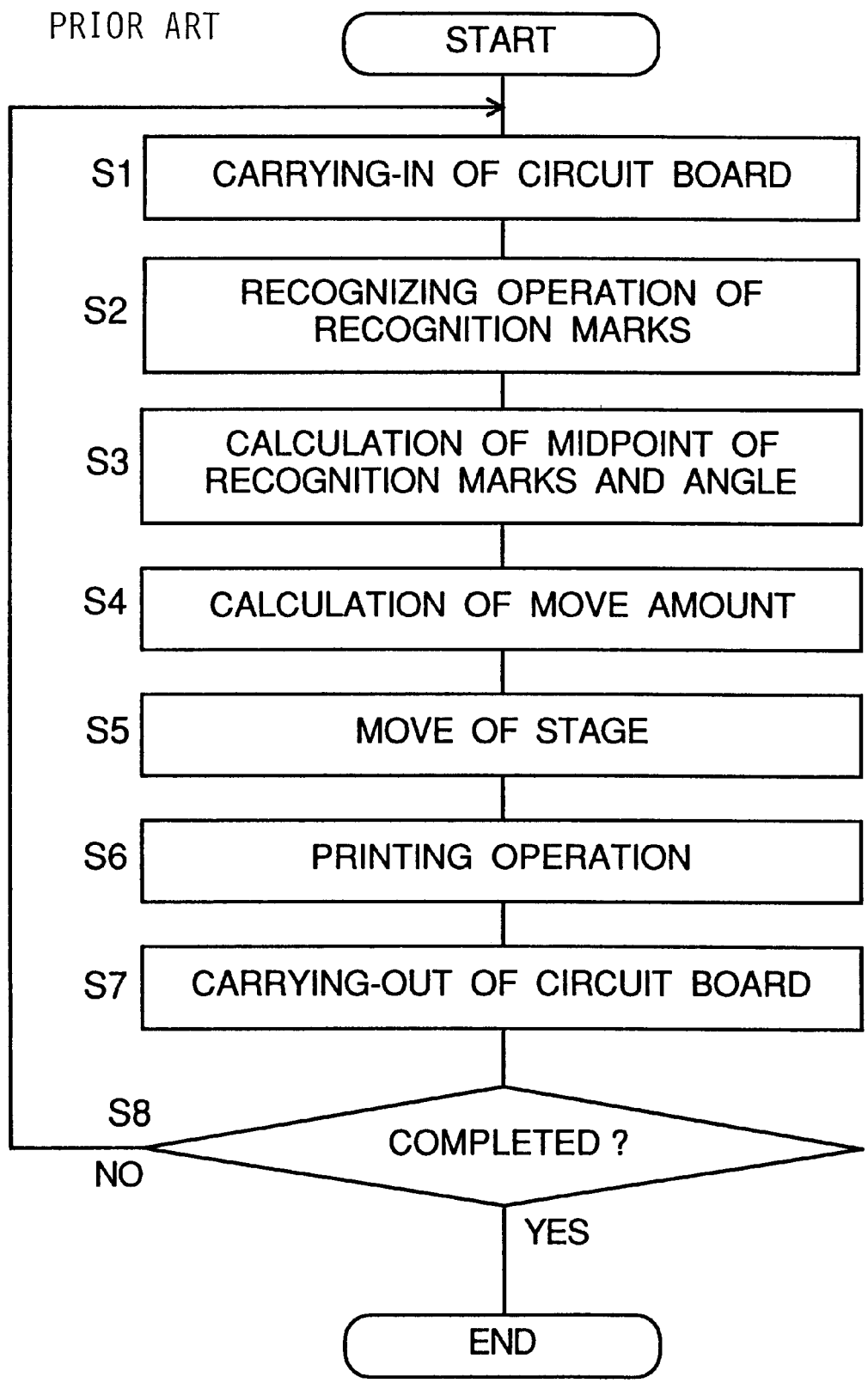
FIG. 10 is a flow chart showing the operation in a screen printing method of the prior art.
Figure 11:
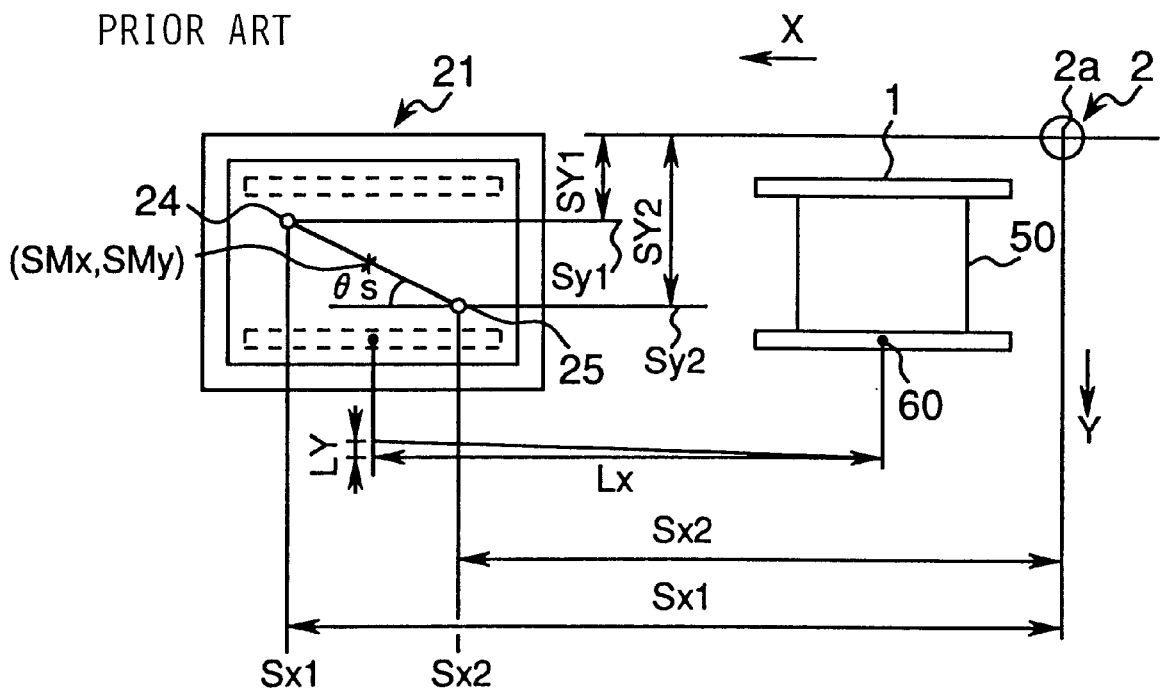
FIG. 11 is a diagram for explaining the method of determining the correction amount for movement of the stage, as shown in the flow chart of FIG. 10.
Figure 12:
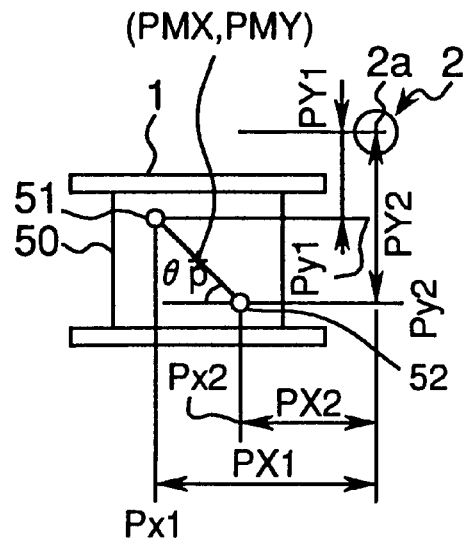
FIG. 12 is a diagram for explaining the method of determining the correction amount for movement of the stage, as shown in the flow chart of FIG. 10.

Now the method of calculating the correction amounts is outlined with reference to FIG. 6. For a simplified explanation, it is assumed that the correction-amount-calculation circuit board 150 is moved relative to the screen 121 set at the screen printing apparatus, so as to be placed into the reference state. The X-Y coordinates are provided with a recognition reference point 181 taken as the origin.

First, two points including a point 201 and a point 202 are arbitrarily taken on the screen 121 set in the screen printing apparatus, and the positions of the two points 201, 202 relative to the recognition reference point 181 are recognized. Based on positional information on the recognized two points 201, 202, positional information on a midpoint 203 of the points 201, 202 is calculated. Also, an angle θs formed by a straight line that passes through the two points 201, 202 and a reference line 230 parallel to, for example, the X axis is calculated.

Meanwhile, with respect also to the correction-amount-calculation circuit board 150 placed on the stage 1, points 221, 222 are arbitrarily taken on the correction-amount-calculation circuit board 150. The positions of the two points 221, 222 relative to the recognition reference point 181 are recognized. Based on positional information on the recognized two points 221, 222, positional information on a midpoint 223 of the points 221, 222 is calculated. Also, an angle θp formed by a straight line that passes through the two points 221, 222 and the reference line 230 is calculated.

It is assumed that when the screen 121 and the correction-amount-calculation circuit board 150 as described above are placed into the reference state, the midpoint 203 and the midpoint 223 are distant from each other by x0 in the X direction and y0 in the Y direction and are shifted from each other by θo in the angular direction as shown in FIG. 6. In addition, the values of x0, y0, θo are equivalent to the correction amount.

Like this, once the correction amount x0, y0, θo are determined, the stage 1 is moved by distances of x0, y0 with respect to the positional information on the midpoint 223 of the correction-amount-calculation circuit board 150 placed on the stage 1. Moreover, the stage 1 is turned by an angle of θo with respect to the angular information θp of the correction-amount-calculation circuit board 150. Then, as in the case of the prior art, the stage 1 is moved to the screen 121 according to the travel amount LX, LY provided for moving the stage 1 to the screen 121, by which the screen 121 and the correction-amount-calculation circuit board 150 are placed into the reference state. In this way, the movement amount for placing the screen 121 and the correction-amount-calculation circuit board 150 into the reference state is given by an amount resulting from adding up the travel amount LX, LY and the correction amount x0, y0, θo.

Thereafter, circuit boards 153 to be placed onto the stage 1 successively are assumed to be placed at the same position as the placement position on the stage 1 where the correction-amount-calculation circuit board 150 has been placed. Also, the screen 121 is fixed. Therefore, determining the correction-amount-calculation board 150 for one time eliminates the need for calculating the correction amount for each circuit board 153. As a result, when each circuit board 153 is placed on the stage 1, the stage 1 is moved according to the correction amount based on the positional information on the midpoint 223 that has already been stored as positional information. Then, the stage 1 is moved according to the travel amount that has previously been known, by which each circuit board 153 is placed into the reference state with respect to the screen 121.

Next, a concrete method of calculating the above movement amount is explained for a case where the correction amount (x0, y0 as shown above) which is equivalent to the shift amount between the midpoints which results when the screen 121 and the correction-amount-calculation circuit board 150 are placed into the reference state, and the correction amount (θo as shown above) which is equivalent to the shift amount in the angular direction have been determined previously. Therefore, moving the stage 1 toward the screen 121 according to the movement amount allows the screen 121 and the correction-amount-calculation circuit board 150 to be placed into the reference state.

The operation of the screen printing apparatus 100 having such a constitution is explained below with reference to FIG. 1.

At Step 201, a new screen 121 is set in a printing device 120, and a correction-amount-calculation circuit board 150 that is the first circuit board to be printed with the new screen 121 is placed on the stage 1. It is noted that the correction-amount-calculation circuit board 150 is not necessarily limited to the use of only one board with respect to the new screen 121. Instead, it is also possible that one correction-amount-calculation circuit board 150 is used every time the printing onto, for example, 1000 circuit boards is completed with the same screen.

Figure 3:
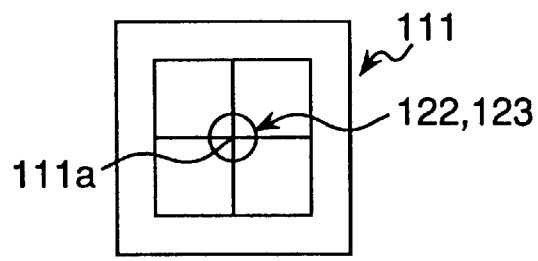
FIG. 3 is a diagram showing one example of the method of recognizing the screen set position and the circuit board placement position, as shown in the flow chart of FIG. 1.

At Step 202, the recognition of a set position of the screen 121 is performed. More specifically, since the screen 121 has no recognition mark drawn like the prior art as described above, the operator selects two openings 122, 123 arbitrarily from among the pattern of openings in the screen 121. Next, the recognition camera 2 is moved to the openings 122, 123. Now taking the opening 122 as an example, as shown in FIG. 3, for example, a midpoint of the opening 122 displayed on the display device 111 is made to coincide with a cross point 111a on the screen of the display device 111, visually. At a time point when the midpoint of the opening 122 and the cross point 111a have coincided with each other, the control device 110 measures the distances from the recognition reference point 181 in the X and Y directions with respect to the opening 122. A similar operation is carried out for opening 123. If the distance of the opening 122 is assumed as (SX1, SY1) and the distance of the opening 123 is assumed as (SX2, SY2), then these distances (SX1, SY1) and (SX2, SY2) can be calculated by the following equation [3]:

$$SX1 = Sx1$$

$$SY1 = Sy1$$

$$SX2 = Sx2$$

$$SY2 = Sy2 \qquad [3]$$

where Sx1, Sx2 are coordinate values in the X direction of the openings 122, 123, respectively, when the recognition reference point 181 is taken as the origin of the X-Y coordinate axes; and where Sy1, Sy2 are coordinate values in the Y direction of the openings 122, 123, respectively, when the recognition reference point 181 is taken as the origin of the X-Y coordinate axes.

The calculation equation [3] is a result of removing (Cx1×SCx1), (Cy1×SCy1), (Cx1×SCx2), (Cy1×SCy2) from the calculation equation [1] as described for the prior art example, where the calculation is enabled by inhibiting the teaching of recognition.

Next, at Step 203, the recognition of the placement position of the correction-amount-calculation circuit board 150 is performed in the same manner as in Step 202. More specifically, the operator selects two lands 151, 152 arbitrarily from among the pattern of lands (pads) on the correction-amount-calculation circuit board 150. Next, the recognition camera 2 is moved to the lands 151, 152, and the control device 110 measures the distances from the recognition reference point 181 in the X and Y directions, respectively, with respect to each of the lands 151, 152, and the control device 110 measures the distances from the recognition reference point 181 in the X and Y directions, respectively, with respect to each of the lands 151, 152 in the manner as described above. If the distance of the land 151 from reference point 181 is assumed as (PX1, PY1) and the distance of the land 152 from reference point 181 is assumed as (PX2, PY2), then these distances (PX1, PY1) and (PX2, PY2) can be calculated by the following equation [4]:

$$PX1 = Px1$$
$$PY1 = Py1$$
$$PX2 = Px2$$
$$PY2 = Py2 \quad [4]$$

where Px1, Px2 are coordinate values in the X direction of the lands 151, 152, respectively, when the recognition reference point 181 is taken as the origin of the coordinate axes; and where Py1, Py2 are coordinate values in the Y direction of the lands 151, 152, respectively, when the recognition reference point 181 is taken as the origin of the X-Y coordinate axes.

Next, based on the information on the distance (SX1, SY1) of the opening 122 (i.e., the coordinate position of the opening 122) as well as on the distance (SX2, SY2) of the opening 123 (i.e., the coordinate position of the opening 123) which have been determined by the above equation [3], the control device 110 determines a coordinate position (SMX1, SMY1) of, for example, a midpoint between the coordinate position of the opening 122 and the coordinate position of the opening 123. Further, the control device 110 determines a straight line that connects the coordinate position of the opening 122 and the coordinate position of the opening 123 with each other, and determines an angle θs1 formed by the straight line and the X axis. The coordinate position (SMX1, SMY1) of the midpoint and the angle θs1 are taken as the target values.

Moreover, in a similar manner, based on the information on the distance (PX1, PY1) of the land 151 (i.e., the coordinate position of the land 151) as well as on the distance (PX2, PY2) of the land 152 (i.e., the coordinate position of the land 152) which have been determined by the above equation [4], the control device 110 determines the coordinate position (PMX1, PMY1) of, for example, a midpoint between the coordinate position of the land 151 and the coordinate position of the land 152. Further, the control device 110 determines a straight line that connects the coordinate position of the land 151 and the coordinate position of the land 152 with each other, and determines an angle θp1 formed by the line and, for example, the X axis.

Next, based on the coordinate position (SMX1, SMY1) and angle θs1 of the midpoint, which are the target values, and on the coordinate position (PMX1, PMY1) and angle θp1 of the midpoint of the correction-amount-calculation circuit board 150, which have been determined as described above, the control device 110 calculates movement amounts (Δx1, Δy1, Δθ1) for moving the stage 1 to the screen 121 by the following equation [5]:

$$\Delta x1 = SMX1 - (PMX1 + LX)$$
$$\Delta y1 = SMY1 - (PMY1 + LY)$$
$$\Delta\theta1 = \theta s1 - \theta p1 \quad [5]$$

where LX, LY are stage travel amounts described for the prior art example.

These movement amounts Δx1, Δy1, Δθ1 are assumed constant at all times even for circuit boards 153, 153, to be placed on the stage 1 in succession to this correction-amount-calculation circuit board 150.

At Step 205, the control device 110 controls the operation of the motors 3 to 5 based on the above move amount (Δx1, Δy1, Δθ1) to perform the correction of the move of the stage 1. After the correction of the move of the stage 1 is performed, the stage 1 is transported to the screen 121 by operational control of the control device 110, and the printing onto the correction-amount-calculation circuit board 150 is performed. Then, at Step 206, the stage 1 (after the printing) is returned to the printed-board loading/unloading position 182 once again, where the printed correction-amount-calculation circuit board 150 is removed from the stage 1.

At Step 207, the circuit board 153 is placed on the stage 1. For each circuit board 153, without executing such a calculation of move amounts as described above for each circuit board 153, the stage 1 is moved at Step 208 by resulting the movement amount (Δx1, Δy1, Δθ1) determined with the correction-amount-calculation circuit board 150. Thereafter, at Steps 209, 210, the printing and the removal and carrying-out of the circuit board 153 from the stage 1 are carried out. At Step 211, it is decided whether or not the printing is to be continued on a subsequent circuit board 153. If the printing is continued, the above Steps 207 through 210 are repeated; if not, the work is ended.

In this embodiment, the stage 1 is moved to the screen 121. However, the arrangement not being limited to this, the screen 121 may be moved to the stage 1 or both of them may be moved together.

Also in this embodiment, for calculating the correction amount and movement amount of the stage 1, it has been arranged that the coordinate position of the midpoint between the coordinate position of the opening 122 and the coordinate position of the opening 123 is utilized for the screen 121. Meanwhile, the coordinate position of the midpoint between the coordinate position of the land 151 and the coordinate position of the land 152 is utilized for the correction-amount-calculation circuit board 150. However, the coordinate position to be determined is not limited to the coordinate positions of the midpoints.

Further, in order to determine the angles θs1, θp1, the X axis has been utilized as the reference line. However, without limitation to this, it is also possible to take, for example, the Y axis or any arbitrary straight line as the reference line.

Figure 4:
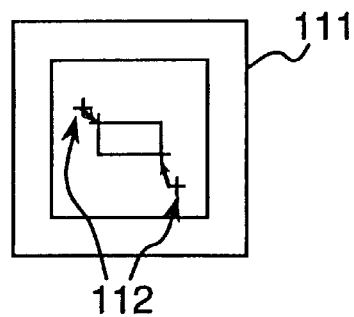
FIG. 4 is a diagram showing another example of the method of recognizing the screen set position and the circuit board placement position, as shown in the flow chart of FIG. 1.

Further, in the above embodiment, a method in which centers of the selected openings and lands in the screen 121 and the correction-amount-calculation circuit board 150 are made to coincide with the cross point 111a of the display device 111 has been adopted. However, there is no limitation to this. That is, the opening and land that the operator selects have such configurations as circles, squares and rectangles. Accordingly, it may be controlled by the control device 110 to automatically measure the midpoints of the selected openings and lands by providing pointers (+) 112 at two places on the display screen of the display device 111 as shown in FIG. 4, and by bringing the pointers 112 to, for example, upper right and lower left points of the openings or lands, or by bringing the pointers 112 to either right and left corner points or up and down corner points of the openings and lands. Adopting such a method allows the operability of the operator to be improved.

In this embodiment, the printing has also been performed with the correction-amount-calculation circuit board 150. Otherwise, the correction-amount-calculation circuit board 150 may be a circuit board that is not subject to printing but purposed merely to determine the correction amount for the move of the stage 1.

Figure 13:
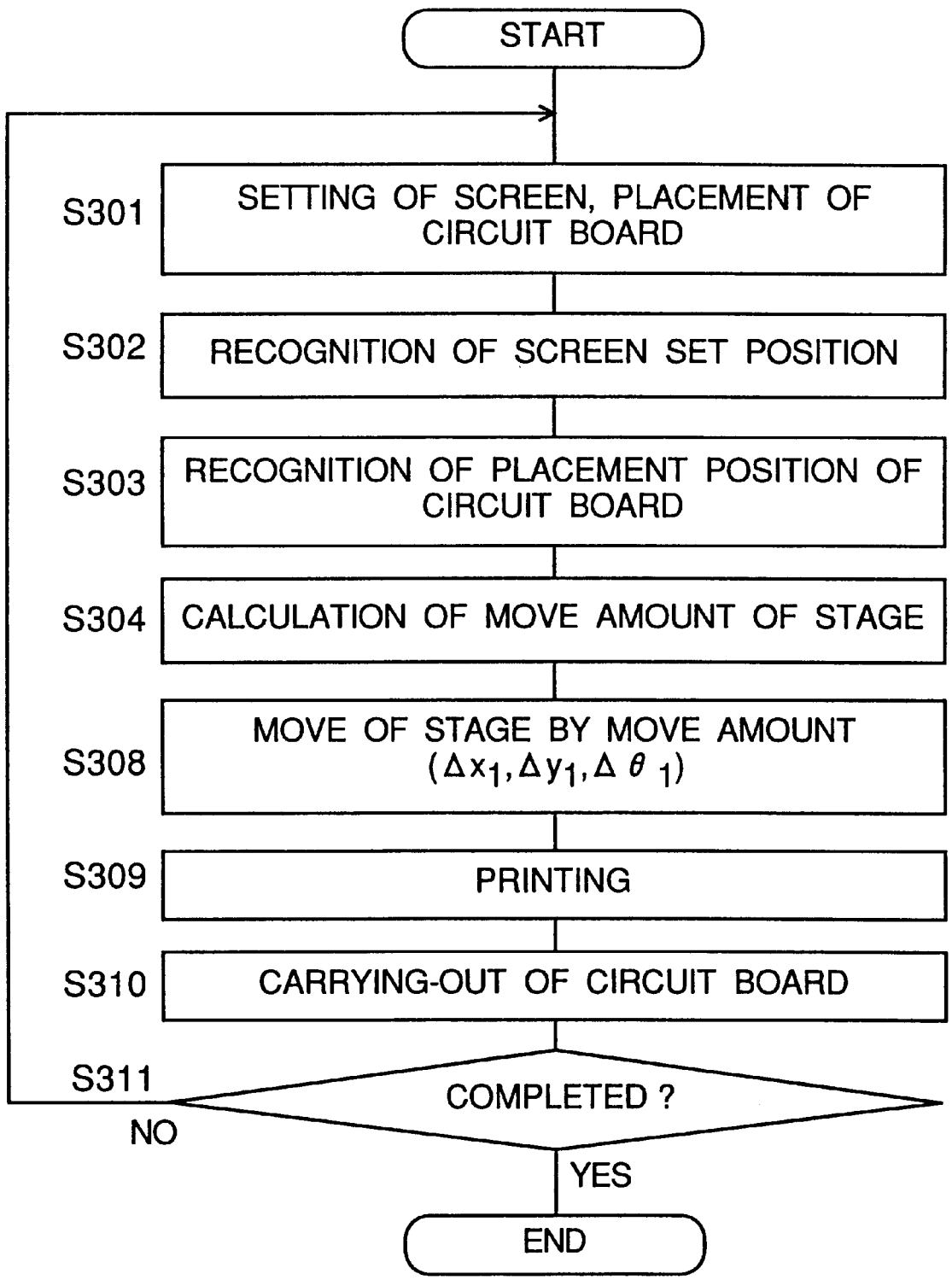
FIG. 13 is a flow chart showing the operation in the screen printing method, which is another embodiment of the present invention.

As shown in FIG. 13, in another simplified embodiment of the present invention, a correction-amount-calculation circuit board may not be used. That is, a screen printing method of this embodiment to be executed by a screen printing apparatus thereof comprises a screen 121 and a stage 1. Circuit boards are placed successively at the same placement position on the stage at such a board loading/unloading position 182 that the circuit board will not overlap with the screen. At least one of the stage and the screen is moved so that the screen and the circuit board are overlaid on each other, and solder paste on the screen is printed on the circuit boards successively. The screen printing method comprises several processes, including when the screen is set to the screen printing apparatus, a set position of the screen relative to a recognition reference point 181 (S302) is recognized. When the circuit board 150 is placed on the stage, a placement position of the circuit board relative to the recognition reference point (S303) is recognized. A correction amount for positions of the screen and the circuit board is calculated based on the set position recognized for the screen and the placement position recognized for the circuit board (S304). At least one of the stage and the screen is moved by taking into consideration the correction amount so that the screen and the circuit board are overlaid on each other, and the solder paste provided on the screen is printed at a pattern printing position on the circuit board (S308–309). The Steps S301 and S310 in the above embodiment of FIG. 13 correspond to the Steps S201 and S210 in the first embodiment of FIG. 1, respectively. At Step 311, it is decided whether or not the printing is continued on a circuit board 153, where if the printing is continued, the above Steps 301 through 310 are repeated; if not, the work is ended.

In the screen printing method of FIG. 13, the recognizing of the screen set position may be accomplished by arbitrarily detecting two different points on the screen and calculating positions of the two points relative to the recognition reference point. Meanwhile, the recognizing of the circuit board placement position may be accomplished by arbitrarily detecting two different points on the circuit board and calculating positions of the two points relative to the recognition reference point.

In FIG. 13, the two different points on the screen are two different arbitrary openings in the screen, and the two different points on the circuit board may be two different arbitrary lands on the circuit board.

In FIG. 13, a reference state is that in which the solder paste on the screen has been printed to the pattern printing position where printing should be performed on the circuit board. The correction amount in this state is calculated based on a shift between a position of the screen in the reference state and the screen set position, and a shift between a position of the circuit board in the reference state and the circuit board placement position.

In these embodiments, a case where solder paste is printed to a circuit board has been taken as an example. However, without being limited to the solder paste, it may be replaced by viscous fluids such as an adhesive that is applied to the circuit board.

As described above, according to the screen printing method and the screen printing apparatus of the embodiments, the move amount(s) is calculated including the correction amount for the movement of the stage 1 with the correction-amount-calculation circuit board 150, and the movement of the stage 1 is controlled by utilizing the move amount(s) determined with the correction-amount-calculation circuit board 150 without calculating the move amount(s) for the succeeding circuit boards 153. As a result, the printing operation can be executed at a higher speed than the conventional counterpart. Further, the openings and lands present on the screen 121 and the correction-amount-calculation circuit board 150 are shot by the recognition camera 2, and coordinate positions of the centers of the openings and lands (i.e., distances from the recognition reference point 181 to the center positions of the openings and lands) are calculated by using the display device 111. As a result, the screen printing method and the screen printing apparatus can also be applied to screens and circuit boards having no recognition marks provided.

As described in detail above, according to the screen printing method of the various aspects of the invention and the screen printing apparatus of the various aspects, a correction amount for the movement of the stage is calculated by using a circuit board. Thereafter, the move of the stage is corrected by taking into consideration the correction amount that has already been determined without calculating the correction amount for circuit boards of the same type. As a result, the printing operation can be executed at higher speed than the conventional counterpart.

The entire disclosure of Japanese Patent Application No. 8-154332 filed on Jun. 14, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A screen printing method comprising:

positioning a circuit board in a loading position on a stage of a screen printing apparatus such that the circuit board does not overlap with a screen of the screen printing apparatus;

recognizing a set position of the screen relative to a recognition reference point by arbitrarily detecting two different points on the screen and by calculating positions of the two points on the screen relative to the recognition reference point when the screen is set;

recognizing a placement position of the circuit board relative to the recognition reference point by detecting two different lands on the circuit board corresponding to the two points on the screen and by calculating positions of the two lands on the circuit board relative to the recognition reference point when the circuit board is placed on the stage;

calculating a correction amount for repositioning at least one of the screen and the circuit board based on the set position recognized for the screen and the placement position recognized for the circuit board;

moving at least one of the stage and the screen such that the screen and the circuit board are overlaid, said moving of at least one of the stage and the screen being based on the correction amount each time a circuit board of a same type is positioned on the stage;

providing solder paste on the screen; and printing the solder paste from the screen onto the circuit board overlaid with the screen.

2. The screen printing method of claim 1, wherein the two different points on the screen comprise two different openings in the screen.

3. The screen printing method of claim 2, wherein when a reference state is defined as a state wherein solder paste on the screen is printed onto the circuit board, said calculating of the correction amount being based on: a shift between a position of the screen in the reference state and a position of the screen in the set position; and a shift between a position of the circuit board in the reference state and a position of the circuit board in the placement position.

4. The screen printing method of claim 1, wherein when a reference state is defined as a state wherein solder paste on the screen is printed onto the circuit board, said calculating of the correction amount being based on: a shift between a position of the screen in the reference state and a position of the screen in the set position; and a shift between a position of the circuit board in the reference state and a position of the circuit board in the placement position.

5. A screen printing method comprising:
   positioning a circuit board in a loading position on a stage of a screen printing apparatus such that the circuit board does not overlap with a screen of the screen printing apparatus;
   recognizing a set position of the screen relative to a recognition reference point by arbitrarily detecting two different points on the screen and by calculating positions of the two points on the screen relative to the recognition reference point when the screen is set;
   recognizing a placement position of the circuit board relative to the recognition reference point by detecting two different points on the circuit board corresponding to the two different points on the screen and by calculating positions of the two points on the circuit board relative to the recognition reference point when the circuit board is placed on the stage;
   calculating a correction amount for repositioning at least one of the screen and the circuit board, a reference state being defined as a state wherein solder paste on the screen is printed onto the circuit board, said calculating of the correction amount being based on: a shift between a position of the screen in the reference state and a position of the screen in the set position recognized for the screen; and a shift between a position of the circuit board in the reference state and a position of the circuit board in the placement position recognized for the circuit board;
   moving at least one of the stage and the screen such that the screen and circuit board are overlaid, said moving of at least one of the stage and the screen being based on the correction amount each time a circuit board of a same type is positioned on the stage;
   providing solder paste on the screen; and
   printing the solder paste from the screen onto the circuit board overlaid with the screen.

6. A screen printing apparatus comprising:
   a screen;
   a stage for carrying a circuit board;
   a moving mechanism for moving at least one of said stage and said screen such that said stage and the circuit board carried by said stage can be overlaid;
   a printer for printing solder paste onto the circuit board from said screen;
   an image capturing device for recognizing a set position of said screen relative to a recognition reference point by arbitrarily detecting two different points on said screen and by calculating positions of said two points on said screen relative to said recognition reference point when said screen is set, and for recognizing a placement position of the circuit board relative to said recognition reference point by detecting two different lands on the circuit board corresponding to said two different points on said screen and by calculating positions of said two lands on the circuit board relative to said recognition reference point when the circuit board is placed on said stage; and
   a control device for calculating a correction amount for repositioning at least one of said screen and the circuit board based on said set position recognized for said screen and said placement position recognized for the circuit board, whereby said moving mechanism moves at least one of said stage and said screen based on said correction amount if a circuit board of a same type is positioned on said stage.

7. The apparatus of claim 6, wherein said two different points on said screen detected by said image capturing device comprise two different openings in said screen.

8. The apparatus of claim 7, wherein a reference state is defined as a state wherein solder paste on the screen is printed onto the circuit board, said control device being operable to calculate the correction amount based on: a shift between a position of the screen in the reference state and a position of the screen in the set position; and a shift between a position of the circuit board in the reference state and a position of the circuit board in the placement position.

9. The apparatus of claim 6, wherein a reference state is defined as a state wherein solder paste on the screen is printed onto the circuit board, said control device being operable to calculate the correction amount based on: a shift between a position of the screen in the reference state and a position of the screen in the set position; and a shift between a position of the circuit board in the reference state and a position of the circuit board in the placement position.

10. The apparatus of claim 6, wherein said image capturing device is operable to capture image data from an arbitrarily selected position on said screen and from a position on the circuit board corresponding to said selected position on said screen so as to recognize a set position of said screen and a placement position of the circuit board.

11. The apparatus of claim 10, wherein a reference state is defined as a state wherein solder paste on the screen is printed onto the circuit board, said control device being operable to calculate the correction amount based on: a shift between a position of the screen in the reference state and a position of the screen in the set position; and a shift between a position of the circuit board in the reference state and a position of the circuit board in the placement position.

12. A screen printing apparatus comprising:
   a screen;
   a stage for carrying a circuit board;
   a moving mechanism for moving at least one of said stage and said screen such that said stage and the circuit board carried by said stage can be overlaid;
   a printer for printing solder paste onto the circuit board from said screen;
   an image capturing device for recognizing a set position of said screen relative to a recognition reference point by arbitrarily detecting two different points on said screen and by calculating positions of said two points on said screen relative to said recognition reference point when said screen is set, and for recognizing a placement position of the circuit board relative to said recognition reference point by detecting two different points on the circuit board corresponding to said two different points on said screen and by calculating positions of said two points on the circuit board relative to said recognition reference point when the circuit board is placed on said stage; and a control device for calculating a correction amount for repositioning at least one of said screen and the circuit board, a reference state being defined as a state wherein solder paste on the screen is printed onto the circuit board, said control device being operable to calculate the correction amount based on: a shift between a position of the screen in the reference state and a position of the screen in the set position recognized for said screen; and a shift between a position of the circuit board in the reference state and a position of the circuit board in the placement position recognized for the circuit board, whereby said moving mechanism moves at least one of said stage and said screen based on said correction amount if a circuit board of a same type is positioned on said stage.

* * * * *